United States Patent
Kennard

(12) 
(10) Patent No.: US 8,778,777 B2
(45) Date of Patent: Jul. 15, 2014

(54) METHOD FOR MANUFACTURING A HETEROSTRUCTURE AIMING AT REDUCING THE TENSILE STRESS CONDITION OF A DONOR SUBSTRATE

(75) Inventor: Mark Kennard, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/254,550

(22) PCT Filed: Sep. 9, 2009

(86) PCT No.: PCT/EP2009/061711
§ 371 (c)(1),
(2), (4) Date: Jan. 9, 2012

(87) PCT Pub. No.: WO2010/099837
PCT Pub. Date: Sep. 10, 2010

(65) Prior Publication Data
US 2012/0100690 A1 Apr. 26, 2012

(30) Foreign Application Priority Data
Mar. 6, 2009 (FR) ........................ 0951433

(51) Int. Cl.
*H01L 21/30* (2006.01)
(52) U.S. Cl.
USPC ........................................ 438/458
(58) Field of Classification Search
USPC ........................................ 438/458, 455–459
See application file for complete search history.

(56) References Cited

U.S. PATENT DOCUMENTS

| | | | |
|---|---|---|---|
| 7,262,466 B2* | 8/2007 | Aitken et al. | 257/347 |
| 2004/0241958 A1 | 12/2004 | Guarini et al. | 438/455 |
| 2004/0253795 A1* | 12/2004 | Martinez et al. | 438/459 |

FOREIGN PATENT DOCUMENTS

| | | |
|---|---|---|
| EP | 1 429 381 B1 | 6/2004 |
| WO | WO 2007/071772 A1 | 6/2007 |

OTHER PUBLICATIONS

International Search Report, PCT/EP2009/061711, mailed Nov. 2, 2009.

* cited by examiner

*Primary Examiner* — Matthew Reames
*Assistant Examiner* — Nicholas J Choi
(74) *Attorney, Agent, or Firm* — TraskBritt

(57) ABSTRACT

A method for manufacturing a heterostructure for applications in the fields of electronics, photovoltaics, optics or optoelectronics, by implanting atomic species in a donor substrate so as to form an embrittlement area therein, assembling a receiver substrate on the donor substrate, wherein the receiver substrate has a larger thermal expansion coefficient than that of the donor substrate, detaching a rear portion of the donor substrate along the embrittlement area so as to transfer a thin layer of interest of the donor substrate onto the receiver substrate, and applying a detachment annealing after assembling and but before detaching, in order to facilitate the detaching. The detachment annealing includes the simultaneous application of a first temperature to the donor substrate and a second temperature different from the first to the receiver substrate; with the first and second temperatures being selected to reduce the tensile stress condition of the donor substrate.

11 Claims, 2 Drawing Sheets

METHOD FOR MANUFACTURING A HETEROSTRUCTURE AIMING AT REDUCING THE TENSILE STRESS CONDITION OF A DONOR SUBSTRATE

PRIORITY CLAIM

This is a national phase entry under 35 U.S.C. §371 of International Patent Application PCT/EP2009/061711 filed Sep. 9, 2009.

BACKGROUND

The present invention relates to a method for making a heterostructure notably intended for applications in the fields of electronics, optics, photovoltaics, or optoelectronics.

This is more specifically a method that comprises the following steps:
 implantation of atomic species inside a first so-called "donor" substrate, so as to form an embrittlement area therein,
 assembly of a second so-called "receiver" substrate on the donor substrate,
 detachment of the rear portion of said donor substrate along the embrittlement area, so as to individualize a thin layer of interest on the receiver substrate.

A method of this kind is generally known under the trademark of SMARTCUT®.

By means of this technique, the specific advantages of the materials of the thin layer and of the support may be combined.

By transferring the layer, it is possible to associate in a same stack, portions which a priori have incompatibilities such as a large difference in the thermal expansion coefficient.

With such structures, one of the problems encountered during their manufacturing is due to the presence of a very strong stress field in the various layers in contact during a heat treatment such as the one during which detachment of the thin layer occurs. These stresses are due to the differential thermal expansion between the materials put into contact.

In such a case, it is essential to perform detachment at a lower temperature than the critical temperature at which the heterostructure will be degraded because of the stresses mentioned above. As the value of the stresses coming into play is related to the thickness of the assembled substrates, it will be noted that after detachment of the layer, the structure may then be subject to more significant heat treatments.

The degradation that may occur during the manufacturing of the final structure is typically breakage of both substrates put into contact with each other and/or their detachment at the bonding interface.

Thus, in the case of the heterostructure of the silicon-on-sapphire ($Al_2O_3$) type, the thermal expansion coefficients (TECs) of silicon and of sapphire are $3.6 \times 10^{-6}/°$ C. and $5.0 \times 10^{-6}/°$ C., respectively. The differential expansion phenomenon first of all occurs at the moment of the heat treatment step intended to cause detachment of the thin layer from the silicon donor substrate.

In such a TEC difference situation, the transfer of the thin layer becomes delicate because the heat treatment steps (such as, for example, detachment annealing), which takes place after adhesive bonding and before transfer, are necessarily limited. Indeed, the different expansion of both assembled substrates may lead to detachment of the assembly or to breakage of the substrate.

The invention is aimed at improving this state of the art.

More particularly, the invention is based on the observation, within the scope of a layer transfer method, notably by the SMARTCUT® technology, that during the assembling of a donor silicon substrate with a sapphire receiver substrate (and more generally when the thermal expansion coefficient (TEC) of a donor substrate is less than the TEC of a receiver substrate), the donor substrate is tensioned during heat treatments, which follow the assembling and lead to fracture.

Now, it seems that the tensioned condition of the material of the donor substrate, in particular at the implanted area, is an obstacle to the propagation and/or development of "platelets" and other microscopic defects, precursors of the fracture phenomenon. More specifically, the orientation of the defects in this stressed material does not seem to occur along a beneficial direction, i.e., in the plane of the plate. This obstacle leads to faulty, delayed fracture or even completely blocked fracture.

SUMMARY OF THE INVENTION

The invention therefore provides a method for manufacturing a heterostructure notably intended for applications in the fields of electronics, optics, photovoltaics or optoelectronics, which comprises the following steps:
 implantation of atomic species inside a first so-called "donor" substrate, so as to form an embrittlement area therein;
 assembly of a second so-called "receiver" substrate, on the donor substrate;
 detachment of the rear portion of said donor substrate along the embrittlement area so as to individualize, a thin layer of interest on the receiver substrate; and
 wherein said receiver substrate has a thermal expansion coefficient larger than that of the donor substrate, and which applies so-called "detachment" annealing after said assembly and before said detachment, in order to facilitate the latter.

This method is remarkable by the fact that said detachment annealing comprises simultaneous application:
 of a first temperature to the donor substrate;
 of a second temperature, different from the first, to the receiver substrate;
 these first and second temperatures being selected so as to reduce the tensile stress condition of the donor substrate.

According to other advantageous and non-limiting features of the invention:
 it comprises a preliminary step that consists in forming or depositing an insulator layer on the donor substrate, so that there exists between them a so-called "binding" interface, and the assembling of the receiver substrate on the donor substrate is performed on the free surface of the insulator layer;
 the assembling of the receiver substrate on the donor substrate is performed by molecular bonding;
 said detachment annealing is accompanied and/or continued with application of mechanical forces;
 application of the first and second temperatures is performed in such a way that the whole of the volume of each substrate has a homogenous temperature;
 said first and second temperatures are applied by placing said structure between two heating electrodes;
 application of the first and second temperatures is performed by placing each substrate on an associated support brought to the corresponding temperature;
 a support associated with each substrate is used, which is an integral part of an adhesive bonding machine;

said donor substrate is in silicon, while the receiver substrate is in sapphire, said first temperature being higher than the second temperature;

said first temperature is of the order of 300° C., while the second temperature is of the order of 80° C.

BRIEF DESCRIPTION OF THE DRAWINGS

Other features and advantages of the invention will become apparent upon reading the detailed description, which follows, of certain embodiments. This description will be made with reference to the appended drawings, wherein FIGS. 1-3 illustrate the main steps of a method for manufacturing a heterostructure, according to the invention, while

DETAILED DESCRIPTION OF THE INVENTION.

The method according to the invention repeats the traditional steps of a SMARTCUT® (registered trademark) type method, as mentioned in the introduction of the present application.

However, the detachment annealing, which induces detachment of the thin layer from the supporting substrate, is conducted in a particular way.

This detachment annealing comprises the simultaneous application:
of a first temperature to the donor substrate;
of a second temperature different from the first temperature to the receiver substrate;
these first and second temperatures being selected so as to reduce the tensile stress condition of the donor material.

Thus, in the case of the manufacturing of a silicon-on-sapphire (SoS) substrate, a temperature applied to the silicon substrate will be selected to be above the one applied to the sapphire substrate. The tensile stress applied to the structure is thereby reduced, as compared with the prior technique, and this therefore promotes or allows fracture.

Further, with the method according to the invention, it is possible to apply a higher temperature at the implanted area than in the prior technique (according to which a same temperature is applied to both substrates), because the deformation originating from the TEC difference of the assembled substrates is less and the breakage risk is more limited. With this, it is therefore possible to facilitate industrial application of the manufacturing method.

Moreover, with this higher temperature, it is possible to obtain a larger bonding energy between both substrates.

And reinforced bonding also contributes to improving the quality of the transferred layer, in particular, if the substrates were assembled by molecular bonding.

Thus, it will be possible to obtain, by applying the method of the invention, a larger total transferred surface and a more regular contour of this surface, as compared with what may be obtained with the techniques from the prior art.

On this basis, the following exemplary embodiment may be applied.

A donor substrate 1 (see FIG. 1) of silicon is used, with a diameter of 300 mm and a thickness of 725 micrometers.

A sapphire receiver substrate 3 is also used with the same diameter and a thickness of 675 micrometers.

The substrate 1 is oxidized at the surface 10 (formation of 50 nanometers of oxide), is cleaned and prepared (for example, by plasma activation), with view to its bonding on the substrate 3.

Figure 1:
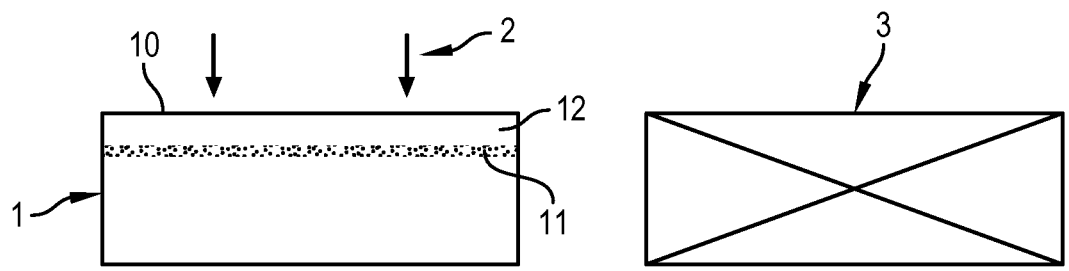

After oxidation and before bonding, substrate 1 is subject to co-implantation of hydrogen and helium ions (arrows 2 of FIG. 1). The latter is performed by using the following doses: H$^+$: between 3 and $6.10^{16}$ at/cm$^2$ and He$^+$: of the order of $2.10^{16}$ at/cm$^2$. Preferentially, helium is implanted first.

The implantation energies are selected between a few keV and 200 keV, depending on the thickness of the layer 12 to be transferred.

This leads to the presence of an embrittlement area 11.

Figure 2:
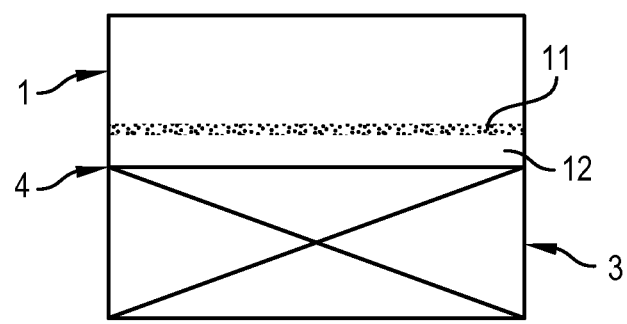

Once bonded, for example, by molecular bonding, which is illustrated by arrow 4, the thereby produced assembly, as it appears in FIG. 2, is subject to annealing for detaching the thin layer 12, which is carried out under the following conditions:

the structure is placed between two heating electrodes, the one positioned on the silicon substrate side being at a temperature above that of the one positioned on the sapphire substrate side;

these temperatures are selected so that the whole of the volume of the silicon substrate is brought to 300° C., and the whole of the volume of the sapphire substrate is brought to 80° C.

The latter temperature is advantageous in order to minimize the stresses from the sapphire and for promoting development of "platelets" in the detachment plane.

In a particular example, the temperatures may be selected so as to place the donor substrate in a slightly compressive stress condition. This has the particular advantage of promoting formation of defects, precursors to fracture.

An alternative to the technique mentioned above consists of placing each of the substrates on a support brought to the adequate temperature, for example, by circulating a liquid in this support. The adequate temperature may be less than room temperature or equal to room temperature. For example, the supporting substrate may be placed on a support, which is temperature-controlled by circulation of a liquid, the temperature of which is less than or equal to room temperature.

Figure 3:
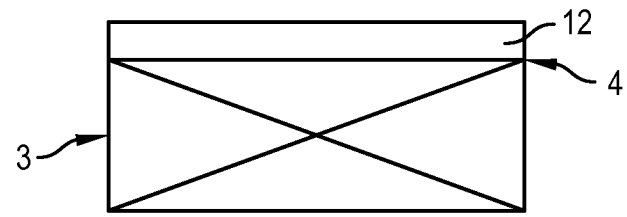
Figure 4:
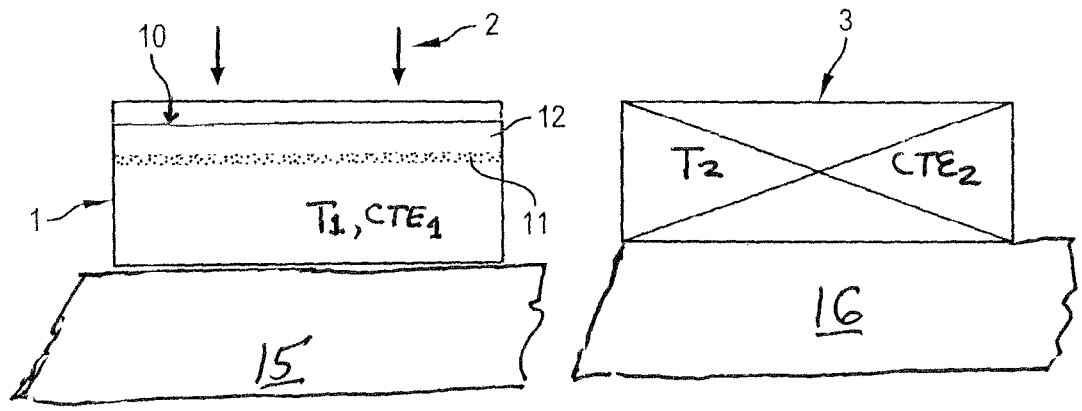
FIGS. 4-6 illustrate a preferred alternative embodiment of the method.
Figure 5:
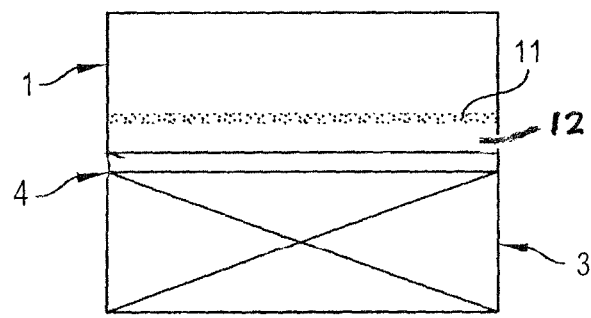
Figure 6:
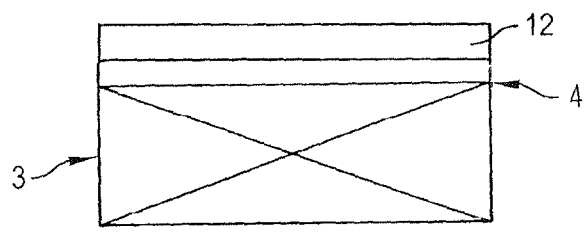

FIGS. 4-6 illustrate this alternative embodiment. In these figures, like numbers are used to designate the same components as in FIGS. 1-3.

The donor substrate 1 has a coefficient of thermal expansion CTE$_1$, while the receiver substrate 3 has a coefficient of expansion CTE$_2$. In accordance with this embodiment of the invention, the materials for the substrates 1 and 3 are selected so that CTE$_2$ is greater than CTE$_1$.

Also illustrated are heated supports 15, 16 for heating, respectively, the donor substrate 1 and receiver substrate 3. The supports 15, 16, which preferably are heating electrodes that are part of a bonding machine, heat their respective substrates to desired temperatures in accordance with the invention, with support 15 heating the donor substrate 1 to temperature T$_1$, and with support 16 heating the receiver substrate 3 to temperature T$_2$. Preferably, the temperatures are selected so that T$_1$ is greater than T$_2$.

Alternatively, application of a first temperature on the donor substrate and of a second temperature on the receiver substrate, may correspond to a simple application of a temperature to the donor substrate while the receiver substrate is only subject to an application of room temperature.

By repeating the preceding alternative, this may correspond to the case when only the support on which the donor substrate is placed is brought to an adequate temperature. In any case, the first and second temperatures lead to reducing the tensile stress condition of the donor material.

This piece of equipment may be a bonding machine having two tool-holders supporting the substrate, allowing them to be brought to the adequate temperature, as mentioned above, and putting them into contact.

In this case, the annealing and fracture may take place in situ in the machine. Alternatively, the fracture may be caused ex situ by applying a mechanical force (for example, by means of a blade applied sideways at the embrittled area).

Finally conventional steps for finishing the thereby formed SoS structure may be applied, such as steps for polishing, stabilization annealing of the bonding interface, sacrificial oxidation, etc.

What is claimed is:

1. A method for manufacturing a heterostructure for applications in the field of electronics, photovoltaics, optics or optoelectronics, which comprises:
   implanting atomic species in a donor substrate so as to form an embrittlement area therein,
   assembling a receiver substrate on the donor substrate, wherein the receiver substrate has a larger thermal expansion coefficient than that of the donor substrate,
   detaching a rear portion of the donor substrate along the embrittlement area so as to transfer a thin layer of interest of the donor substrate onto the receiver substrate, and
   applying a detachment annealing after assembling but before detaching, in order to facilitate the detaching,
   wherein the detachment annealing comprises the simultaneous application of a first temperature to the donor substrate and a second temperature different from the first temperature to the receiver substrate, wherein the first temperature is approximately 300° C., while the second temperature is approximately 80° C.

2. The method according to claim 1, further comprising forming or depositing an insulator layer on the donor substrate prior to assembling to provide the insulator layer between the donor and receiver substrates.

3. The method according to claim 1, wherein the assembling of the receiver substrate on the donor substrate is achieved by molecular bonding.

4. The method according to claim 1, wherein the detachment annealing is accompanied or continued by applying mechanical forces.

5. The method according to claim 1, wherein the application of the first and second temperatures is accomplished in such a way that the whole of the volume of each substrate has a homogenous temperature.

6. The method according to claim 5, wherein the first and second temperatures are applied by placing the structure between two heating electrodes.

7. The method according to claim 5, wherein the application of the first and second temperatures is accomplished by placing each substrate on a support having the corresponding temperature.

8. The method according to claim 7, wherein the supports are an integral part of a bonding machine.

9. The method according to claim 1, wherein the donor substrate comprises silicon, and the receiver substrate comprises sapphire.

10. The method according to claim 1, further comprising applying mechanical forces during or after the detachment annealing to assist in the detaching.

11. The method according to claim 1, wherein the donor substrate has a diameter of 300 mm and the atomic species to be implanted includes hydrogen and helium.

* * * * *